United States Patent [19]

O'Connell et al.

[11] 4,195,356
[45] Mar. 25, 1980

[54] SENSE LINE TERMINATION CIRCUIT FOR SEMICONDUCTOR MEMORY SYSTEMS

[75] Inventors: Timothy R. O'Connell; George S. Leach, both of Phoenix, Ariz.

[73] Assignee: Electronic Memories and Magnetics Corporation, Encino, Calif.

[21] Appl. No.: 961,240

[22] Filed: Nov. 16, 1978

[51] Int. Cl.² ............................................. G11C 11/40
[52] U.S. Cl. .................................. 365/189; 365/78; 307/238
[58] Field of Search .................. 365/78, 189, 190, 202; 307/238, 279

[56] References Cited

U.S. PATENT DOCUMENTS

3,795,898  3/1974  Metha et al. ........................ 365/189

Primary Examiner—Terrell W. Fears

[57] ABSTRACT

A sense line termination circuit is provided intercoupled between a sense line of a plurality of static memory cells and a supply bus of high pull-up voltage to provide fast access to the memory cells with limited medium power dissipation. The termination circuit functions to pull up the sense line toward a predetermined intermediate high voltage value (which is about one threshold voltage Vt below the high pull-up voltage) when no memory cell has a low voltage memory node coupled to the sense line. The sense line termination circuit limits the voltage excursion of the sense lines and also permits the sense line to be pulled down with predetermined current limitation to a low voltage value when the sense line is coupled to a low voltage memory node. In a preferred embodiment, the sense line termination circuit comprises an enhancement mode FET device whose drain and gate are connected to the supply bus and whose source is connected in series with the drain of a depletion mode FET device whose source is connected to the sense line and whose gate may be connected to the same sense line or to other suitable gate bias voltage sources. The enhancement device has a substantially constant voltage drop across it from the pull-up supply voltage to the intermediate voltage, and substantially all the voltage variations between pull-up and pull-down occur across the depletion device. The enhancement device is preferably substantially larger in size and current carrying capacity than its corresponding depletion device.

17 Claims, 7 Drawing Figures

SENSE LINE TERMINATION CIRCUIT FOR SEMICONDUCTOR MEMORY SYSTEMS

BACKGROUND OF THE INVENTION

1. Field of the Invention

This invention relates to semiconductor memories and more particularly to an improved memory sense line termination circuit for coupling a memory sense line to a supply bus of relatively high pull-up voltage.

2. Description of the Prior Art

In present day semiconductor static memory systems of the type which are established as integrated circuits on the surface of a semiconductor substrate, a sense line termination circuit may comprise a single depletion mode field effect device whose drain is connected to a supply bus of high pull-up voltage Vcc and whose gate and source are connected together to the sense line. A depletion device so-connected functions as an always conductive, current limiting, variable voltage dropping impedance, coupling the sense line to the supply bus of relatively high pull-up voltage. Thus, for example, if the supply bus pull-up voltage is +5 volts, the so-connected depletion mode device will permit the sense line to be pulled down by an accessed memory cell node to close to 0 volts and will thereafter upon de-access of the memory cell, pull up the sense line to substantially the full 5 volt value of the supply bus pull-up voltage. Although a sense line having such a depletion device termination circuit has satisfactory medium power dissipation, it also has only medium switching speeds which limit the access time to the memory cells.

In another present day semiconductor static memory system, a sense line termination circuit may comprise a single enhancement mode device whose drain and gate are connected to the supply bus of high pull-up voltage Vcc and whose source is connected to the sense line. An enhancement device so-connected will in pull-up of the sense line raise the sense line to a voltage value which is one threshold voltage Vt below the high pull-up voltage and will in pull-down permit the sense line to be pulled down to the low voltage of an accessed memory node. Thus, for example, if the supply bus pull-up voltage is +5 volts and the effective threshold voltage of the enhancement field effect device is 1½ volts, then the so-connected enhancement mode device will permit the sense line to be pulled down by an accessed memory cell node to close to 0 volts and will thereafter upon de-access of the memory cell pull up the sense line to approximately 3½ volts which is approximately one threshold voltage below the full 5 volt value of the supply bus pull-up voltage.

In such operation the enhancement device has almost 5 volts across it following pull-down, and has approximately 1½ volts across it following pull-up, so that it operates as a sense line load impedance having variable, very differing voltages across it during the two phases of operation of the sense line. A sense line having such an enhancement device termination circuit has somewhat higher but still only medium switching speed, and it also has undesirably high power dissipation, which limits the usability of such sense line termination circuits in large memory systems.

Thus in the prior art we have one type of sense line termination circuit (the single depletion device), whose use results in medium switching speed and medium power dissipation, and we also have in the prior art another type of sense line termination circuit (the single enhancement device as described) whose use results in somewhat higher but still medium switching speeds, but also relatively unsatisfactory high power dissipation.

The several deficiencies of these prior art sense line termination circuits have in the past been accepted as unavoidable (without introduction of clocking systems), and the selection of one or the other of the prior art termination circuits has been a standard matter of engineering compromise. It has in the past appeared logical that higher switching speeds should require higher power dissipation and that use of lower power dissipation should result in lower switching speeds, and the factors causing these limitations in operation of the prior art termination circuits have not been carefully investigated.

SUMMARY OF THE INVENTION

In contrast, the present Applicants have carefully analyzed and investigated the sources of limitation in the performance of prior art sense line termination circuits, and with the knowledge and understanding gained from such analysis, have invented a novel type of sense line termination circuit which uses an enhancement device and a depletion device in series combination with each other between the pull-up voltage supply bus and the sense line. They have demonstrated that use of such novel sense line termination circuit results in high switching speeds with satisfactory medium power dissipation.

In a preferred embodiment, the enhancement device has its drain and gate connected together and to the high pull-up voltage supply bus and its source connected to the drain of the depletion device whose source is connected to the sense line. The gate of the depletion device in a preferred arrangement may be connected to its source. In such a combination, the enhancement device functions in a different manner than in the prior art single enhancement device circuits. In the present circuit the voltage drop across the enhancement device remains approximately constant and unvarying at approximately one threshold voltage Vt below the high pull-up voltage Vcc, both after pull-up and pull-down. The enhancement device in this application thus provides a substantially constant voltage drop from the high pull-up voltage to an intermediate voltage value Vi which is approximately one threshold below the high pull-up voltage of the supply bus. The enhancement device is able to function in this manner because of the current limiting effects of the depletion device in their overall series combination. Thus in the overall series combination of the enhancement device and the depletion device, there is a substantially constant voltage drop across the enhancement device and substantially all the required varying voltage drops of the termination circuit occur across the depletion device. This desired operation is enhanced by having the enhancement device have substantially greater size and current carrying capacity than its corresponding depletion device, so that for example the W/L (width to length ratio) of the enhancement device may be 10 times or more the W/L ratio of the depletion device.

As described in the present application, if the memory cells of the memory system are to be coupled to two sense lines, then each sense line is provided with such a sense line termination circuit according to the invention having an enhancement device in series combination with the depletion device in the described manner. In such application, each sense line termination circuit may have its own enhancement device or, alternatively, a single enhancement device may be shared in common by both sense line termination circuits. In this alternative arrangement, a single enhancement device has its drain and gate connected to the supply bus of high pull-up voltage. The source of the enhancement device is connected through one depletion device to one sense line and through a second depletion device to the other sense line of a memory cell column. The shared or common enhancement device may be made somewhat larger in size and hence current carrying capacity to assist in regulation or constancy of the voltage drop thereacross to prevent undesired coupling between the sense lines. The shared enhancement device can still be made smaller in size than the sum of the two separate enhancement devices it replaces, partially because of the fact that the current load presented to the shared enhancement device by the two sense lines tends to be somewhat constant (since either one side or the other of an accessed memory cell will be conducting to its corresponding sense line) thus alleviating the load changes presented to the shared enhancement device.

In order to understand the manner in which the novel sense line termination circuits of the present invention are able to achieve both high switching speeds and medium power dissipation, it is valuable at this time to briefly review the analysis which the present Applicants have made of the sources of performance limitation in the prior are systems.

Referring to the prior art system which uses a single enhancement device as a sense line termination circuit, such an enhancement device as before stated has (assuming a +5 volt supply voltage and 1½ volt effective thresholds) either a 1½ volt drop across it after pull-up or it has a nearly 5 volt drop across it after pull-down. Thus in pull-down the enhancement device has a very high, nearly +5 volt gate-to-source voltage which permits very high current to be drawn through the enhancement device, thus causing the high power dissipation which characterizes the single enhancement device termination circuit. This high current flow in pull-down would also require unacceptably high current acceptance and large physical size of the memory cells, and in order to prevent such a result the enhancement device is restricted in size to thereby limit its peak current flow in pull-down to high but acceptable values. However, this same size restriction of the enhancement device also limits even more severely (because of smaller gate-to-source bias in pull-up) the current available for pull-up, and therefore slows down the switching speed of the sense line in pull-up to medium switching speeds.

Referring to the prior art memory systems utilizing a single depletion device as the termination circuit for each sense line, the present Applicants have found that one significant source of its medium to low switching speeds arise from the fact that in pull-up or pull-down of the sense line, the highly capacitive sense line has to be charged from nearly 0 volts to +5 volts (the value of the Vcc pull-up voltage) or discharged from 5 volts to close to 0 volts. Charging and discharging of the capacitive sense line over such a large voltage excursion with the limited current of the depletion device requires a very considerable switching time which limits access time to the memory cells.

In addition there is an output signal delay time problem which arises during pull-down of the sense line from its high +5 volt value toward its low near 0 volt value. Because the sense amplifier is ordinarily connected to the sense line through a Y or column access FET device, the sense amplifier cannot receive any signal from the sense line until the threshold voltage requirement of the column access FET device is satisfied, and this does not occur (assuming a +5 volt Y access voltage is used) until enough delay time has passed for the sense line to be pulled down one threshold voltage Vt below the +5 volts of the supply bus pull-up voltage Vcc. Thus, for example, if the threshold voltage Vt of the FET devices is 1.5 volts, then a sense line signal voltage which is switching or dropping over a period of time from 5 volts to near 0 volts will not be able to affect the input leads of the sense amplifier until it has dropped below 3.5 volts. Because the input leads of the sense amplifier are highly capacitive, the resultant delay in beginning discharge of the sense amplifier leads increases access time.

The manner in which the novel termination circuit of the present invention remedies the deficiencies of the prior art circuits and facilitates both high switching speed and satisfactory medium power dissipation will become further clarified in the description provided in the present application.

DESCRIPTION OF THE PREFERRED EMBODIMENTS

Figures 1, 2, 3:
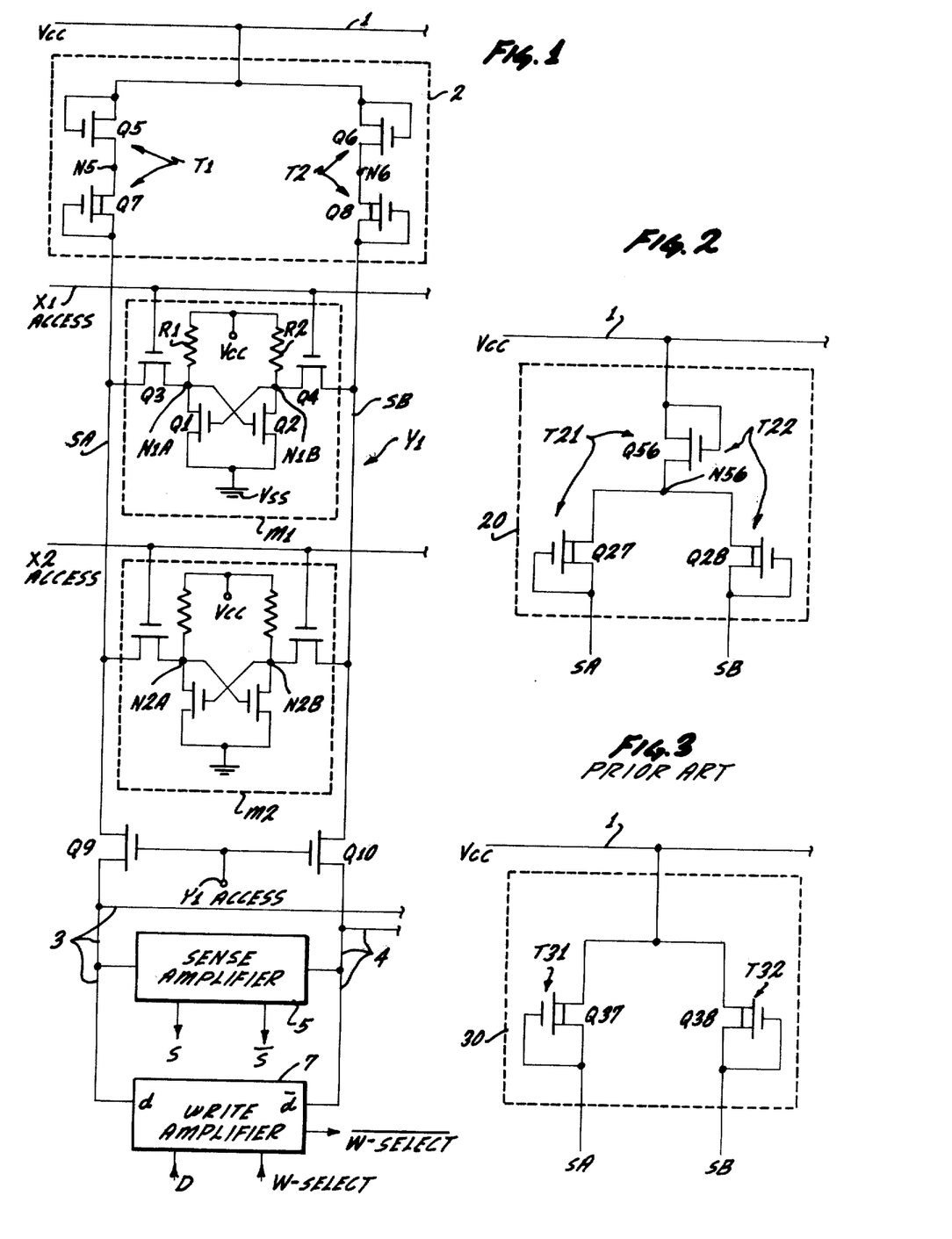
FIG. 1 is a schematic partly block, partly circuit diagram of a column of memory cells having two sense lines and including a termination unit having sense line termination circuits according to the invention.
FIG. 2 is a schematic circuit diagram showing an alternative termination unit according to the invention.
FIG. 3 is a schematic circuit diagram of a prior art termination unit having single depletion device termination circuits for each sense line.

FIG. 1 is an illustration of a part of a memory system and shows a column generally designated Y1 of memory cells. For purposes of convenience only two memory cells M1 and M2 of column Y1 are shown in FIG. 1, but it will be understood that many more memory cells could be utilized in the column Y1 in the same manner as described.

It will be also understood that although only one column Y1 of memory cells is shown in FIG. 1, that many additional columns such as column Y2, column Y3, etc. could be utilized in an enlarged memory system in the same manner as is described.

Referring in more detail to memory cell M1, it can be considered to be a conventional static memory cell consisting of a cross coupled static flip flop circuit comprising FET devices Q1 and Q2 and their corresponding load impedances shown here as resistors R1 and R2 respectively, the memory nodes N1A and N1B of the static flip flop being connected respectively through FET devices Q3 and Q4 respectively to corresponding conductive sense lines SA and SB respectively. FET devices Q3 and Q4 serve as X access switches to connect or access the memory nodes N1A and N1B respectively to their corresponding sense lines SA and SB respectively under the control of the voltage of an X1 access signal which may be applied along a conductive X1 access line to intermediate connections to the gate electrodes of Q3 and Q4 respectively. Thus application of a high X1 access voltage has the effect of coupling the internal memory nodes N1A and N1B to their corresponding sense lines SA and SB respectively.

It should be noted that memory node N1A of static memory cell M1 is connected through its load resistor R1 to a supply point of voltage Vcc, is connected to the drain of FET device Q1 and to the drain of FET device Q3, and is also connected in a cross coupling connection to the gate electrode of FET device Q2. Similarly, memory node N1B is connected through its load resistor R2 to a supply point of voltage Vcc, is connected to the drain of FET device Q2 and to the drain of FET device Q4, and is also connected in a cross-coupling connection to the gate electrode of FET device Q1. The sources of FET devices Q1 and Q2 are both connected to receive an applied voltage Vss which may be the common or ground voltage and may be also considered as the low or pull-down voltage of the circuit in comparison to the high or pull-up voltage Vcc. In the overall operation of the bi-stable flip flop circuit device of memory cell M1, either FET device Q1 or FET device Q2 will be conducting in accordance with the state of the bi-stable flip flop.

The voltage at memory node N1A will be at a relatively high value, at or near the high pull-up voltage Vcc, if device Q1 is non-conducting; and will be at a relatively low voltage, near ground, if device Q1 is conducting. Memory node N1B will have voltage levels which are complementary to memory node N1A. That is if memory node N1A has a high voltage value, then memory node N1B will have a low voltage value and similarly if memory node N1A has a low voltage value, then memory node N1B will have a high voltage value. We will assume for purposes of example that the pull-up voltage Vcc of the memory cells is +5 volts and that the pull-down or return voltage Vss of the memory cell is ground or 0 volts. In this instance we can consider that the voltage value of memory node N1A varies between a high value of at or close to +5 volts and a low value of close to 0 volts.

The voltage values of memory nodes N1A and N1B do not affect their corresponding sense lines SA and SB so long as devices Q3 and Q4 are non-conducting and thereby decouple and isolate the memory cell nodes from their corresponding sense lines. However, when a, for example, +5 volt X1 access voltage is applied, both devices Q3 and Q4 are enabled, thereby tending to switch or couple the memory nodes N1A and N1B to their corresponding sense lines SA and SB respectively.

Memory cell M2 can be considered to be identical to memory cell M1 having corresponding internal memory nodes N2A and N2B which are coupled to sense lines SA and SB respectively in response to application of an X2 access signal to the gates of the X access FET devices of memory cell M2.

As is conventional in semiconductor memory systems, it will be understood that in the ordinary and desired mode of operation of reading from the memory, only one memory cell in a particular column is to be selected (i.e., to have its internal memory nodes coupled to the sense lines) and accordingly at one time only a single X access signal is applied at a high value to select the corresponding memory cell of the column.

Sense lines SA and SB are each coupled to a supply bus 1 of the high pull-up voltage Vcc through a pull-up sense line termination unit 2, which includes a sense line termination circuit generally designated T1 which operates with sense line SA, and also includes a second sense line termination circuit generally designated T2 which operates with sense line SB. As shown in FIG. 1, termination circuit T1 comprises an enhancement device Q5 and a depletion device Q7 connected in series combination between sense line SA and supply bus 1 of high pull-up voltage Vcc, and similarly sense line termination circuit T2 comprises an enhancement device Q6 and a depletion device Q8 connected in series combination between sense line SB and supply bus 1 of the high pull-up voltage Vcc.

Referring in more detail to sense line termination circuit T1, it is seen that enhancement device Q5 has its drain and gate connected together and to the supply bus Vcc. The source of Q5 is connected to the drain of Q7, and the gate and source of Q7 are connected together and to the sense line SA.

Similarly, referring in more detail to sense line termination circuit T2, it is seen that the gate and drain of Q6 are connected together and to the supply bus 1 of high pull-up voltage Vcc. The source of Q6 is connected to the drain of Q8 whose gate and source are connected together and to the sense line SB. Thus each of the sense lines SA and SB has a corresponding sense line termination circuit T1 and T2 respectively, which couples the sense line to the supply bus of relatively high pull-up voltage Vcc. These termination circuits act as the load impedances or pull-up impedances for their respective sense lines.

The other end of each of the sense lines SA and SB may be coupled in response to application of a Y1 access voltage through Y access field effect devices Q9 and Q10 respectively to the input buses 3 and 4 respectively of a Sense Amplifier 5, which operates as a differential amplifier producing an output signal $\bar{S}$ which is at a high value when the signal on bus 3 is high (and the signal on bus 4 is low) and is at a low value when the signal on bus 3 is low (and the signal on bus 4 is high). Sense Amplifier 5 also produces a complementary output signal S which has a value opposite to the value of output signal $\bar{S}$. In the coupling of sense lines SA and SB to the input busses of Sense Amplifier 5, it will be noted that sense line SA is connected to the drain of FET device Q9 whose source is connected to bus 3, while sense line SB is connected to the drain of FET device Q10 whose source is connected to bus 4. The gates of Q9 and Q10 are connected together in common to receive the Y1 access signal which, at a high value has the effect of causing devices Q9 and Q10 to become conductive and couple the sense lines SA and SB to the input busses 3 and 4 respectively at Sense Amplifier 5.

A Write Amplifier 7 may also be provided as shown in FIG. 1 having outputs d and $\bar{d}$ connected to busses 3 and 4 respectively and receiving as inputs thereto a data signal D and a write select signal W-Select. If the W-Select signal is high to enable the Write Amplifier 7, then Write Amplifier 7 in response to high or low levels of data signal D will impress a corresponding high or low signal d on bus 3 and a corresponding complementary or opposite valued signal $\bar{d}$ on bus 4. Write Amplifier 7 as shown in FIG. 1 may also have available a separate output for a signal $\overline{\text{W-SELECT}}$ (the inverse or complement of W-Select) which may be utilized if desired for special functions, as will later be described in connection with FIG. 7.

It will be understood that selection of a particular memory cell in any Y column of the memory system, for either reading from or writing therein, may be accomplished by simultaneously applying the corresponding X access signal and Y access signal each at a high value to select the corresponding memory cell of the column by coupling memory nodes of the memory to the sense lines of the column and coupling the sense lines of the column to the busses 3 and 4. Thus, for example, if memory cell M1 is to be selected, then the X1 access signal is applied at a high value to couple memory nodes N1A and N1B to sense lines SA and SB respectively, and at the same time the Y1 access signal is applied to couple the sense lines SA and SB through Q9 and Q10 to the busses 3 and 4 respectively, thus making memory cell M1 accessible for either reading therefrom by Sense Amplifier 5 or for writing therein by Write Amplifier 7.

During reading, if memory cell M1 is being read and it is desired next to read from memory cell M2 then to accomplish first de-access of memory cell M1 and then access to memory cell M2, first the voltage of the X1 access signal is switched from its high value toward its low value and then after a suitable delay to allow sufficient switching time for the "down" sense line to be pulled up, the voltage of the X2 access signal is switched toward its high value. Thus the switching time of the sense lines, especially during pull-up, critically determines the access time to the memory cells for successive reading operations.

Similarly before performing a write operation, it is desirable that all memory cells be first de-accessed before a particular selected memory cell is accessed for writing therein, so that all unselected memory cells will be de-coupled from and isolated from the sense lines during the write operation. Again the time required to complete the de-accessing of the memory cells is determined by the switching time, especially during pull-up, of the sense lines, which in this manner critically affects the access time for write.

It is therefore desirable to examine in greater detail the switching of the sense lines and the manner in which such switching of each sense line is affected by the operation of the corresponding sense line termination circuit.

Referring, for example, to sense line termination circuit T1, it functions normally to attempt or tend to pull up the voltage on its sense line SA toward an intermediate high voltage value Vi which is approximately equal to the high pull-up voltage Vcc less the effective threshold voltage of the enhancement device Q5. This limits the peak voltage of the sense lines to Vi (approximately one threshold voltage below Vt) and this limits the voltage excursion of the sense lines to approximately the difference between Vi and the lower memory node value. This limitation of the voltage excursion of the sense lines tends to allow fast charge and discharge of the sense lines in pull-up and pull-down, thus increasing switching speed. (Because of the uniformity of processing of devices on a single substrate, the effective threshold voltages tend to be somewhat constant and uniform for all enhancement devices on the memory system substrate subject to the normal small body effect variations resulting from varying signals applied thereto in circuit operation).

If no memory cell is accessed, both sense lines SA and SB will be pulled upward as described to the intermediate high voltage value Vi. If we assume a 5 volt memory system in which Vcc is +5 volts, and we further assume that the effective threshold voltage of the enhancement devices is 1½ volts, then the intermediate voltage Vi is 3½ volts and therefore when no memory cell is accessed, the voltage on both sense lines will rise to approximately 3½ volts.

This is the normal or desired condition of the sense lines before a reading operation is done, namely that both sense lines are high before a memory cell is accessed. When a memory cell such as memory cell M1 is accessed, in accordance with the state of the memory cell, one of its memory nodes, for example, node N1A will be at a low voltage value near 0 volts and the other of its memory nodes will be at a high voltage value at or close to 5 volts and therefore the low memory node N1A will be coupled through Q3 to sense line SA and will pull down the voltage on SA toward the low voltage value of the memory node. (Note that the threshold voltage requirement of device Q3 is satisfied in that it has the +5 volts of the X1 access voltage at its gate and voltage at its gate and near 0 volts at its source so that it has greater than 1½ volts gate-to-source voltage and therefore will be conductive.)

At the same time the high valued memory node N1B will permit the sense line SB to remain at a substantially high value. In the particular memory cell which is shown in FIG. 1 this is particularly true because the threshold voltage requirements of device Q4 are not satisfied and therefore Q4 is non-conductive and continues to isolate node N1B from the sense line SB. (Note in this connection that Q4 has close to 5 volts at the internal node N1B, has 5 volts at its gate and has 3½ volts at the sense line SB, and since the gate voltage does not exceed either terminal of Q4 by 1½ volts the threshold requirement of Q4 is not satisfied and Q4 remains essentially non- or minimally-conducting.)

Accordingly as we complete access to memory cell M1, sense line SA will be pulled down from the intermediate high voltage Vi (+3½ volts) to a low voltage value close to 0 volts and sense line SB will remain at the intermediate voltage value of Vi (+3½ volts).

It is clear that the overall effect of accessing a memory cell is to pull down one of the sense lines and leave the other sense line at its intermediate high value. As indicated both pull-down and pull-up of the sense lines require substantial sense line switching periods because the sense lines are highly capacitive and time is required to charge the sense lines to a high value with current from the pull-up termination circuit or discharge them to a low value with current from an accessed low memory node.

It should be noted in this described operation of accessing memory cell M1, that as soon as sense line SA begins to drop below its intermediate high voltage value Vi the dropping signal is immediately communicated through Y access device Q9 to input bus 3 of Sense Amplifier 5, thus further contributing to fast access time. Such immediate transmission of the change in the output signal on sense line SB is accomplished because the threshold voltage requirement (assumed to be near 1½ volts) of device Q9 is promptly satisfied. Device Q9 initially has a 3½ volt voltage on its drain and a +5 volt Y1 access voltage on its gate (thus already has a 1½ volt positive bias between gate and source) and therefore as soon as the signal in SA begins to drop below 3½ volts, the gate-to-source threshold voltage requirement of device Q9 can be satisfied and the signal on the sense line SA is immediately conducted to bus 3 of Sense Amplifier 5 without any delay whatsoever as the change in its condition begins.

As previously noted, a highly capacitive sense line such as line SA has to be charged when it is pulled up by charging current delivered to it through its pull-up termination circuit and has to be discharged as it drops to a low voltage value by discharge current delivered to it by the low valued node of the selected memory cell. Also at steady state pull-down, the low node has to accept all the current then delivered to it by the pull-up termination circuit.

If the current flow through the termination circuit at pull-down were high, then there would be two deleterious effects, namely (1) that the low node of the memory cell would be excessively loaded which would decrease the stability of the memory cell and require a very large memory cell, and (2) that the high constant current consumption of the system would result in a high power dissipation for the memory system as a whole which is considered undesirable in most applications requiring large amounts of memory.

Fortunately a sense line termination circuit according to the invention, such as sense line termination circuit T1, will limit the current drawn therefrom when the sense line is pulled low and thereby (1) limits the loading of the accessed memory cell thereby contributing to its stability and allowing use of small memory cells, and (2) also limits the power dissipation of the overall memory system. In addition, a sense line termination circuit according to the invention such as sense line termination circuit T1 can utilize a relatively large enhancement device so that during pull-up of its sense line it can charge at high speed the sense line capacity in a nearly linear fashion to the intermediate voltage value of Vi (rather than exponentially) thus speeding pull-up of its sense line. The termination circuit of the invention also limits the voltage excursion over which the sense line capacitance has to be charged or discharged, thereby speeding up both pull-up and pull-down of the sense line.

These desirable features of the sense line termination circuit of the invention can be delineated and clarified by studying in more detail the operation of one of the sense line termination circuits such as circuit T1. The discussion will be equally applicable, of course, to the matching sense line termination circuit T2.

Referring in more detail to sense line termination circuit T1, as before mentioned, depletion device Q7 has its gate connected to its source so that it has a constant 0 volts gate-to-source voltage. Since the threshold voltage of a depletion device may be approximately $-2$ volts, the threshold voltage requirement of depletion device Q7 is always satisfied and therefore device Q7 will be continually conductive. Thus if nothing pulls down the voltage at the source of Q7, it will track or replicate the voltage at the drain of Q7, while if the drain of Q7 is pulled down (by sense line SA being pulled to a low value) the device Q7 will sustain all of such voltage drop across it while at the same time limiting the current through Q7 in accordance with the constant current characteristic of a depletion device having a constant 0 volt gate-to-source bias.

In the overall termination circuit T1, enhancement device Q5, as previously noted, has its gate and drain connected together and to the supply bus 1 of high pull-up voltage Vcc, and has its source connected at node N5 to the drain of depletion device Q7. When enhancement device Q5 is connected in series in this manner with the depletion device Q7, the enhancement device Q5 can be provided to operate in an entirely different manner than it would if the depletion device Q7 were not so-connected in combination with it. First, enhancement device Q5 can be made as large as desired because the depletion device will provide current limitation during pull-down. Thus the enhancement device can be made large enough so that it will not limit current during pull-up. (This is in contrast to the prior art in which a restricted size enhancement device which limits current during pull-down operates to very severely limit current during pull-up). It has been found that satisfactory circuit operation is obtained when the size (W/L ratio) of the enhancement device is approximately ten times the size (W/L ratio) of the corresponding depletion device. L in this connection is the length of source to drain spacing of the device and W is the width of the device in its dimension which is opposite or orthoganal to the L direction. The size of the enhancement device can be further increased if desired, if space is available. Second, during pull-up the voltage at N5 at the source of enhancement device Q5 will not rise higher than $3\frac{1}{2}$ volts (assuming $Vt = 1\frac{1}{2}$ volts) because above that point the threshold voltage requirement of enhancement device Q5 would not be satisfied and enhancement device Q5 would become non-conductive and throttle off current therethrough. Thus during pull-up, the voltage at node 5 is limited to approximately $3\frac{1}{2}$ volts and since depletion device Q7 is conductive and its source is not being pulled down, the voltage at the source of Q7 on sense line SA substantially tracks or replicates the voltage at node N5 and is therefore also at approximately $3\frac{1}{2}$ volts. During pull-down because of another important interaction between devices Q5 and Q7, the voltage at N5 will not be pulled down substantially and will remain at $3\frac{1}{2}$ volts because Q7 sufficiently limits the current through enhancement device Q5 and thereby prevents the enlargement of current therethrough which would be required to have a greater voltage drop across Q5. Accordingly, the voltage at node N5 remains approximately one threshold voltage below Vcc both in pull-up and in pull-down and substantially the whole voltage change between pull-in and pull-down occurs as a changing voltage drop across the depletion device Q7.

Thus for example, assuming Vcc of $+5$ volts and effective enhancement threshold voltage of approximately $1\frac{1}{2}$ volts, then the voltage at node 5 would be approximately one threshold voltage below Vcc or $3\frac{1}{2}$ volts during pull-up and would be substantially the same or only a few tenths of a volt below that during pull-down; while under the same circumstances the voltage at the source of Q7 would be approximately $3\frac{1}{2}$ volts during pull-up and would drop to nearly 0 volts during pull-down of sense line SA. Thus during both pull-up and pull-down, enhancement device Q5 has a substantially fixed voltage drop across it of approximately one enhancement threshold voltage Vt, while the depletion device Q7 has a voltage drop across it which varies from close to 0 volts during pull-up to slightly less than $3\frac{1}{2}$ volts during pull-down.

Overall, therefore, the termination circuit T1 functions to limit the peak voltage of the sense line SA to one threshold voltage below Vcc, (approximately $3\frac{1}{2}$ volts in the present example) thereby limiting the voltage excursion of the capacitive sense line SA to permit faster charge and discharge thereof. Moreover, the termination circuit T1 limits the current therethrough during pull-down, thereby limiting power dissipation to acceptable medium levels, and contributing to the stability of the selected memory cell by avoiding excessive loading of the memory node which is coupled to sense line SA. Moreover, the combination of the depletion device's current limitation and the relatively large enhancement device permits much higher current in pull-up, thus facilitating fast switching speed. In addition, because the peak voltage on sense line SA has been already reduced to one threshold voltage below the high pull-up voltage Vcc, any drop in the signal on the sense line during pull-down immediately begins to satisfy the threshold voltage requirement of Y1 (of Y) access FET device Q9, and such signal is therefore communicated without delay to input bus 3 of Sense Amplifier 5 to immediately begin changing the output reading of Sense Amplifier 5. Such immediate access of the dropping sense line signal to the Sense Amplifier is important because of the capacitive nature of the input busses of the Sense Amplifier which can therefore be changed by discharge most effectively if the sense line signal is continuously applied thereto during its whole change period.

As indicated, the scaling of the size and hence current capacities of Q5 and Q7 has a number of favorable results. The voltage at node N5 tends to be more constant and unvarying between pull-up and pull-down. Because substantially all current limitation during pull-up is provided by Q7, charging current through the series combination of Q5 and Q7 tends to be provided at a corresponding constant current value until the very last moment at which the voltage at node N5 (and SA) reaches the one threshold below Vcc value and the current therethrough is then abruptly pinched off by Q5. Such constant current charging (rather than exponential charging) of sense line SA during pull-up tends to speed up pull-up. Also during pull-down, discharge current through the series combination of Q5 and Q7 tends to be controlled by the more nearly constant current limitations of Q7, thereby providing both the required current limitation in pull-down and facilitating fast discharge of the sense line by the accessed memory node by eliminating any heavy current loading thereof. And, as noted, there is no undue current limitation in pull-up, thereby obtaining fast switching speeds in the critical pull-up operation.

In the above description we have especially discussed operation of sense line termination circuit T1 in coordination with its sense line SA, its corresponding memory nodes, its Y access device Q9, and the Sense Amplifier input bus 3. It will be understood that sense line termination circuit T2 is preferably symmetrical to T1, its enhancement device Q6 and depletion device Q8 having the same relationship to each other and the same interactions with the corresponding sense line SB, the corresponding memory nodes N1B and N2B, the corresponding Y access Q10, and input bus 4 of Sense Amplifier 5.

Referring now to FIG. 2, there is shown an alternative sense line termination circuit 20 which makes use of the fact that the voltage at the source of the enhancement device is substantially constant in both pull-up and pull-down and that therefore a single enhancement device can be shared and utilized in common by two sense line termination circuits. As shown in FIG. 2, termination unit 20 comprises a single enhancement device Q56 whose drain and gate are connected together and to the supply bus 1 of high pull-up voltage Vcc, with the source of Q56 being connected at a node N56 to the drains of a depletion device Q27 and a depletion device Q28. The gate and source of depletion device Q27 are connected together and to the sense line SA, and the source and gate of the depletion device Q28 are connected together and to the sense line SB. As indicated in FIG. 2, the series combination of enhancement device Q56 and depletion device Q27 can be considered as a sense line termination circuit T21 which services sense line SA in the same manner that termination circuit T1 of FIG. 1 services sense line SA; and similarly, the shared enhancement device Q56 and depletion device Q28 connected in series combination can be considered to comprise a sense line termination circuit T22 which services sense line SB in the same manner. Even though each of the termination circuits shares this same single enhancement device 056, the operation of each sense line termination circuit will remain essentially as described in connection with FIG. 1. Undue interaction between the two sense lines because of the shared enhancement device is avoided by making the shared enhancement device Q56 large enough in current carrying capacity to keep the voltage at node N56 substantially constant and thereby prevent undesired interactions between the two sense lines. The enhancement device Q56 operates in such overall combination as a constant voltage generator for the voltage at the shared node N56, which voltage is approximately one threshold below the high pull-up voltage Vcc.

In the sizing of the FET devices of termination unit 20 the depletion devices Q27 and Q28 may be substantially identical to Q7 and Q8 of termination unit 2 of FIG. 1. Enhancement device Q56 may be the same size, but will ordinarily be larger in size and current carrying capacity than either Q5 or Q6 alone, but need not necessarily be as large in active area as the sum of the active areas of Q5 and Q6. The reason why the size and corresponding current capacity of Q56 need not double is that the enhancement devices are already generously sized, and also that the load presented to Q56 is somewhat constant because of the fact that the sense lines SA and SB are complementary so that only one or the other of the sense lines will be pulled down, and therefore their parallel combination will present a somewhat constant current load to Q56.

Figure 4:
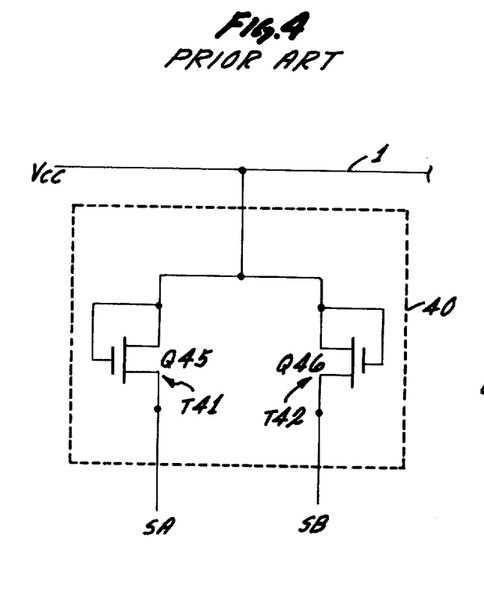
FIG. 4 is a schematic circuit diagram of a prior art termination unit having single enhancement device termination circuits for each of the sense lines.

Before considering other embodiments of the sense line termination circuit of the present invention, it is desirable to briefly examine prior art sense line termination circuits as shown in FIG. 3 and 4 respectively in order to further clarify the various operating deficiencies of such prior art circuits and the corresponding advantages of the novel sense line termination circuit of the present invention.

Referring to FIG. 3, there is shown a prior art sense line termination unit 30 having a sense line termination circuit T31 servicing sense line SA and a sense line termination circuit T32 servicing sense line SB. As shown in FIG. 3, sense line termination circuit 31 comprises a single depletion device Q37 having its drain connected to the supply bus 1 of high pull-up voltage Vcc and its gate and source connected together and to the sense line SA. Sense line termination circuit T32 similarly comprises a single depletion device Q38 connected up in the same manner between the supply bus 1 of Vcc and the sense line SB. Considering termination circuit T31, the source of Q37, (and hence sense line SA) will, in pull-up and pull-down, swing between the assumed +5 volt value of Vcc and the nearly 0 volt value of an accessed low valued node for a total voltage excursion of nearly 5 volts, rather than a limited voltage excursion of 3½ volts. That is the voltage excursion permitted sense line SA is very nearly the full voltage difference between Vcc and Vss rather than that voltage difference decreased by one threshold voltage. Because charging and discharging of the sense line SA over such a wide voltage range requires considerable time, the sense line SA will have only medium switching speed when operated with such a prior art sense line termination circuit. In addition, during pull-down the falling signal on sense line SA will not be able to gain access to the Sense Amplifier input bus 3 until the voltage thereon has dropped one full threshold voltage below Vcc, to thereby satisfy the threshold voltage requirement of Y access FET device Q9 and thereby permit coupling of the sense line to input bus 3 of Sense Amplifier 5. The resultant time delay in communication of the falling sense line signal to the Sense Amplifier is a further limitation on the switching speed of a sense line equipped with such prior art sense line termination circuit.

Referring to FIG. 4, there is shown another different prior art sense line termination unit 40 having a sense line termination circuit T41 which services sense line SA and a sense line termination circuit T42 which services sense line SB. As indicated in FIG. 4, sense line termination circuit T41 comprises a single enhancement device Q45 whose drain and gate are connected together and to the supply bus 1 of high pull-up voltage Vcc, the source of Q45 being connected to sense line SA. Similarly, termination circuit T42 comprises a single enhancement device Q46 whose drain and gate are connected together and to the supply bus 1 and whose source is connected to the other sense line SB. In the operation of each of these sense line termination circuits (as for example termination circuit T41), the peak pull-up voltage to which the sense line is allowed to rise during pull-up is limited by the enhancement device to one threshold drop below Vcc so that a sense line equipped with such prior art termination circuits has a limited voltage excursion over which to switch. However, during pull-down the voltage on the sense line (and hence at the source of the enhancement device) is pulled down to nearly 0 volts, thus impressing a large voltage difference across the enhancement device. The enhancement device in response thereto has a large current flow therethrough. This causes high steady state power dissipation for a memory system equipped with such prior art sense line termination circuits, and also heavy loading of the accessed memory cell nodes. This, in turn, adversely affects the stability of and increases the power requirements for the individual memory cells. In addition, in order to provide some intrinsic current limitation in the pull-down situation, the enhancement devices utilized will ordinarily be retricted in size so as to inherently provide some required current limitation in pull-down. However, this same size restriction also limits the current available for pull-up and, therefore, tends to greatly slow down the switching speed of the sense lines during pull-up. Overall memory systems having sense lines equipped with the prior art termination circuits of FIG. 4 will therefore tend to have medium switching speed, accompanied however by high power dissipation.

Summarizing the effects of these prior art sense line termination circuits, it can be seen that the single depletion device sense line termination circuit is associated with medium switching speeds and with medium power dissipation. The prior art single enhancement device sense line termination circuit is associated with medium switching speed and with high power dissipation. In contrast, the sense line termination circuit of the present invention as shown and described in connection with FIGS. 1 and 2 operates in the manner described to yield fast switching speed with medium power dissipation, and as described, substantially removes the major operating deficiencies of the prior art sense line termination circuits.

Having discussed the prior art devices, we can now return to discussion of alternative embodiments of the sense line termination circuits according to the invention.

Figure 5:
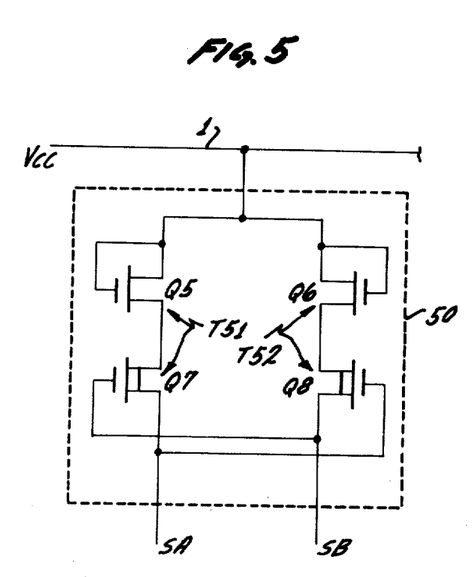
FIG. 5 is a schematic circuit diagram of a modified form of the termination unit of FIG. 1.

Referring to FIG. 5, there is shown a sense line termination unit 50 which is a modified form of termination unit 2 of FIG. 1 and which is characterized by the fact that its depletion devices each have their gates connected to the opposite sense line rather than to the sense line which is being serviced by the depletion device. Thus in unit 50, the gate of Q7 is connected not to its own sense line SA but is instead connected to the opposite sense line SB, while similarly the gate of Q8 is connected not to its own sense line SB but to the opposite sense line SA. The cross connection to the sense lines of the gates of the depletion devices decreases somewhat the current limiting abilities of each sense line termination circuit in pull-down. However, it also greatly increases the current available for charging of the sense lines during pull-up. Also once pull-up has been fully obtained, current is decreased to a minimum.

The manner in which this occurs can be readily understood. Referring for example to sense line termination circuit T51 which services sense line SA, if sense line SA has been pulled down low, the gate of depletion device Q7 will, nevertheless, be high because of its connection to the opposite sense line SB, thus making Q7 more conductive than it would otherwise be, and thereby somewhat decreasing the current limiting ability of depletion device Q7 during pull-down. When the selected memory cell is de-accessed so that sense line SA begins to rise in a pull-up operation, the gate of Q7 will continue to be high because sense line SB to which it is connected is already high and will remain so during the pull-up operation. Thus Q7 will be rendered strongly conductive during most of the pull-up transition, thus permitting much higher switching speeds of sense line SA during pull-up than would be otherwise obtained. Similar remarks apply to sense line SB and its corresponding termination circuit T52 and its operation when the depletion devices are connected in cross-coupled manner as described. Note that the peak voltage of either sense line during pull-up thereof will still be approximately one threshold voltage below Vcc because the enhancement devices continue their same function of maintaining their sources at this intermediate high voltage value. Because of the heavier current loading of a memory cell during pull-down, the minimal or low voltage value of the sense lines will tend to be somewhat higher than the near 0 volts which is encountered in a circuit such as that of FIG. 1 and may, for example, be approximately 2 volts.

Figure 6:
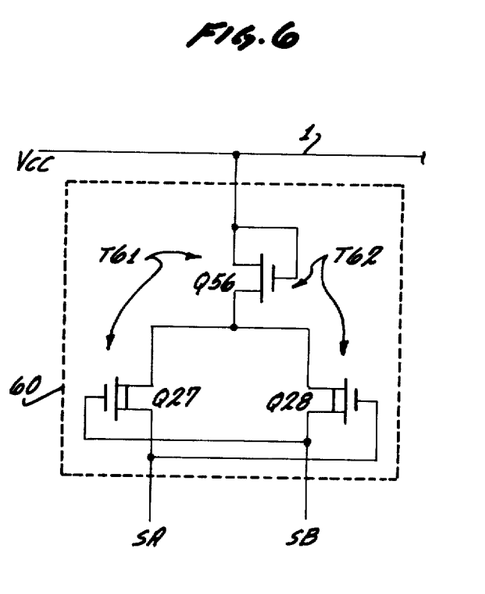
FIG. 6 is a schematic circuit diagram of a modified form of the termination unit of FIG. 2.

FIG. 6 shows a termination unit 60 which is a modified form of termination unit 20 of FIG. 2, differing only in that the depletion devices Q27 and Q28 do not have their gates connected to their corresponding sense lines SA and SB, but instead have these gates cross-connected to the opposite sense lines, so that the gate of Q27 is connected to SB and the gate of Q28 is connected to SA. Because of this modification of the gate connections, the respective sense line termination circuits are given different designations T61 and T62 respectively. The effect of the cross-coupling of the gate-to-sense line connections has the same effect upon the operations of the sense line termination circuits as has been previously described in connection with the similar cross-coupling arrangement of FIG. 5.

It will be noted in connection with both FIG. 5 and FIG. 6 that when the depletion device servicing a sense line has its gate connected in this cross-coupled manner, the depletion device has its gate relatively high during both pull-down operation and pull-up operation. This is the natural consequence of the fact that in ordinary read operation both sense lines are pulled up before a pull-down of one of the sense lines is made for a next read operation. Thus with the cross-coupling arrangement of the gate-to-sense line connections, a depletion device whose sense line is being pulled down will have its gate connected to the opposite sense line which still remains up; and when the sense line which is down is allowed to be pulled up, the gate of its depletion device remains high during the pull-up operation because of its connection to the opposite sense line which has remained high throughout. Note further that the high values of gate bias signal can readily be overridden by the data signals during write, so as to remove unnecessary loading of the write amplifier during write.

Figure 7:
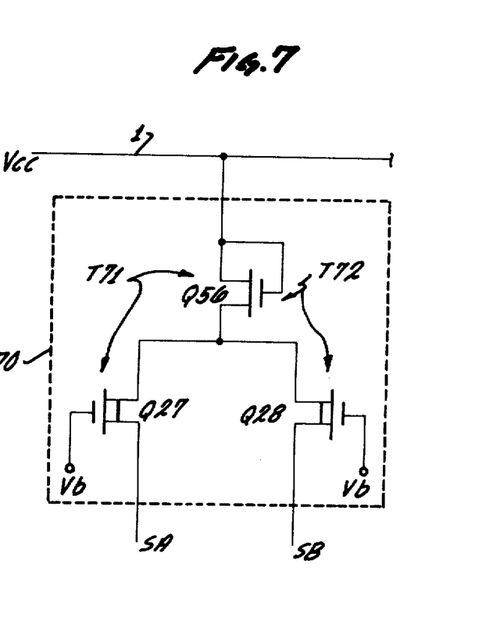
FIG. 7 is a schematic circuit diagram of another modified form of the termination unit of FIG. 2.

With this understanding we can see that yet another modification of the termination unit of FIG. 2 (or of FIG. 1) would be permissible in which the gates of the depletion devices are connected to a suitable relatively high voltage signal. Such an exemplary modification is shown in FIG. 7 which shows a termination unit 70 which may be identical to termination unit 20 of FIG. 2, except for the modification that the gates of its depletion devices Q27 and Q28 are each connected to a suitable supply point of a selected relatively high voltage gate bias signal Vb which can be readily removed or overridden during write. Preferably the selected relatively high voltage gate bias signal Vb should be a voltage signal already readily available on the semiconductor substrate in which the integrated circuit of the memory system is established. Thus, for example, the predetermined gate bias signal Vb may be selected as the separately available complementary write select signal $\overline{\text{W-SELECT}}$, to serve as the gate bias signal Vb. When the separate $\overline{\text{W-SELECT}}$ output of Write Amplifier 7 is connected to be applied to the gates of Q27 and Q28 in this manner (i.e., Vb=$\overline{\text{W-SELECT}}$) it has the effect of normally maintaining the gates of Q27 and Q28 at a high level except during the write operation when signal $\overline{\text{W-SELECT}}$ goes low, thus preventing during write any undue loading of the Write Amplifier by the pull-up termination circuits. It will be evident that the termination unit of FIG. 1 can be modified in the same manner by connecting the gates of its depletion devices to a supply point of the gate bias voltage Vb in accordance with the various options for such connection as outlined above in connection with FIG. 7.

What is claimed as new is:

1. A semiconductor memory system comprising:
 a plurality of memory cells, each memory cell having a 1st memory node having a high or low voltage value in accordance with the state of the memory cell;
 a 1st sense line for said plurality of memory cells, said 1st sense line being selectively coupleable to a 1st memory node of a selected one of said plurality of memory cells, each 1st memory node at its low voltage value being capable when coupled to said 1st sense line of pulling said 1st sense line to a corresponding low voltage value;
 a supply bus of relatively high pull-up voltage;
 a 1st sense line termination circuit interconnected between said 1st sense line and said supply bus of relatively high pull-up voltage for pulling said 1st sense line toward a predetermined intermediate voltage value when no 1st memory node at a low voltage value is coupled to said 1st sense line, and for permitting said 1st sense line to be pulled down to a low voltage value when a 1st memory node at a low voltage value is coupled thereto;
 said 1st sense line termination circuit comprising a 1st enhancement mode FET device and a 1st depletion mode FET device connected in series with each other and between said 1st sense line and said bus of relatively high voltage, the source of one FET device being connected to said 1st sense line and the drain of the other FET device being connected to said supply bus, said 1st enhancement mode FET device having its drain and gate interconnected.

2. The memory system of claim 1 wherein said 1st enhancement mode FET device has approximately the same voltage drop thereacross from its drain to its source both when said 1st sense line is pulled up toward the intermediate voltage value and when said 1st sense line is pulled down to a low voltage value, said voltage drop thereacross being approximately equal to the effective gate-to-source threshold voltage Vt of said 1st enhancement mode FET device.

3. The memory system of claim 2 wherein said predetermined intermediate voltage value to which said 1st sense line is pulled up is approximately equal to said high pull-up voltage of said supply bus less the effective threshold voltage Vt of said 1st enhancement mode device.

4. The memory system of claim 2 wherein said voltage drop across said 1st enhancement mode FET device is at least 20% of the voltage difference between the high pull-up voltage of the supply bus and the low voltage value of the memory nodes.

5. The memory system of claim 2 wherein said voltage drop across said 1st enhancement mode device is approximately 30% of the voltage difference between the supply bus voltage and the low voltage value of the memory nodes.

6. The memory system of claim 1 or claim 2 wherein said 1st enhancement mode FET device has its drain and gate interconnected to said supply bus of relatively high pull-up voltage, and said 1st depletion mode FET device has its source and gate interconnected to said 1st sense line.

7. The memory system of claim 1 wherein said 1st enhancement mode FET device has its drain and gate interconnected to said supply bus of relatively high pull-up voltage and said 1st depletion mode FET device has its source connected to said 1st sense line and its gate connected to receive an applied complementary write signal which has a low voltage value when information is being written into the memory system and has a high voltage value when information is not being written therein.

8. The memory system of claim 1 wherein the W/L width-to-length ratio of said 1st enhancement mode FET device is substantially greater than the W/L width-to-length ratio of said 1st depletion mode FET device.

9. The memory system of claim 1 wherein said 1st enhancement mode FET device has a W/L width-to-length ratio which is approximately ten times the W/L width-to-length ratio of said 1st depletion mode FET device.

10. The memory system of claim 1 or claim 2 which further includes a 2nd sense line for said plurality of memory cells, each memory cell having a 2nd memory mode selectively coupleable to said 2nd sense line and having a high or low voltage value which is opposite to the voltage value of the 1st memory node of that memory cell, and a 2nd sense line termination circuit interconnected between said 2nd sense line and said supply bus of relatively high pull-up voltage, said 2nd sense line termination circuit comprising a 2nd enhancement mode FET device and a 2nd depletion mode FET device connected in series with each other between said sense line and said supply bus of relatively high voltage, said 1st and 2nd enhancement mode FET devices each having its drain and gate interconnected to said supply bus and said 2nd depletion mode FET device having its source connected to said 2nd sense line.

11. The memory system of claim 10 wherein said 1st depletion mode FET device has its gate connected to a predetermined one of said 1st and 2nd sense lines and said 2nd depletion mode FET device has its gate connected to the other of said 1st and 2nd sense lines.

12. The memory system of claim 11 wherein said 1st depletion mode FET device has its gate connected to said 1st sense line and said 2nd depletion mode FET device has its gate connected to said 2nd sense line.

13. The memory system of claim 1 or claim 2 which further includes a 2nd sense line for said plurality of memory cells, each memory cell having a 2nd memory node selectively coupleable to said 2nd sense line and having a high or low voltage value which is opposite to the voltage value of the 1st memory node of the 1st memory cell, said 1st enhancement mode FET device having its drain and gate interconnected to said supply bus, and said 1st depletion mode FET device having its source connected to said 1st sense line and its gate connected to a predetermined one of said 1st and 2nd sense lines.

14. The memory system of claim 13 wherein said 1st depletion mode FET device has its gate connected to said 1st sense line.

15. The memory system of claim 13 which further includes a 2nd sense line termination circuit interconnected between said 2nd sense line and said supply bus of relatively high pull-up voltage for pulling said 2nd sense line toward the predetermined intermediate voltage value when no 2nd memory node at a low voltage value is coupled to said 2nd sense line, and for permitting said 2nd sense line to be pulled down to a low voltage value when a 2nd memory node at a low voltage value is coupled thereto, said 1st enhancement mode device being used and shared in common by both said 1st sense line termination circuit and said 2nd sense line termination circuit, said 2nd sense line termination circuit comprising said 1st enhancement mode FET device and a 2nd depletion mode FET device connected in series with each other between said 2nd sense line and said supply bus, said 2nd depletion mode FET device having its drain connected to the source of said 1st enhancement mode FET device and having its source connected to said 2nd sense line.

16. The memory system of claim 15 wherein said 1st depletion mode FET device has its gate connected to one of said 1st and 2nd sense lines and said 2nd depletion mode FET device has its gate connected to the other of said 1st and 2nd sense lines.

17. The memory system of claim 16 wherein said 1st depletion mode FET device has its gate connected to its source and said 1st sense line and said 2nd depletion mode FET device has its gate connected to its source and said 2nd sense line.

* * * * *